(12) United States Patent
Ireland

(10) Patent No.: US 6,696,359 B1
(45) Date of Patent: Feb. 24, 2004

(54) DESIGN LAYOUT METHOD FOR METAL LINES OF AN INTEGRATED CIRCUIT

(75) Inventor: Philip J. Ireland, Nampa, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/231,938

(22) Filed: Aug. 30, 2002

(51) Int. Cl.[7] ............... H01L 21/4763; H01L 21/316
(52) U.S. Cl. .................... 438/624; 438/637; 438/668; 438/669
(58) Field of Search ................... 438/624, 763, 438/789, 573, 579, 666, 668, 669, 673, 637, 926, 587, 592, 598, 671, 687; 257/773, 774, 775

(56) References Cited

U.S. PATENT DOCUMENTS

| | | | |
|---|---|---|---|
| 5,763,955 A | * | 6/1998 | Findley et al. ............ 257/775 |
| 5,789,313 A | * | 8/1998 | Lee ............................ 438/599 |
| 5,790,417 A | * | 8/1998 | Chao et al. ................. 716/21 |
| 5,798,298 A | * | 8/1998 | Yang et al. ................ 438/622 |
| 5,866,482 A | * | 2/1999 | Lee ............................ 438/720 |
| 5,905,289 A | * | 5/1999 | Lee ............................ 257/368 |
| 5,915,201 A | * | 6/1999 | Chang et al. .............. 438/631 |
| 5,924,006 A | * | 7/1999 | Lur et al. ................... 438/626 |
| 5,937,323 A | | 8/1999 | Orczyk et al. |
| 5,956,618 A | * | 9/1999 | Liu et al. ................... 438/183 |
| 5,965,940 A | * | 10/1999 | Juengling .................. 257/752 |
| 5,981,384 A | | 11/1999 | Juengling |
| 6,239,008 B1 | | 5/2001 | Yu et al. |
| 6,259,115 B1 | * | 7/2001 | You et al. .................... 257/48 |
| 6,309,956 B1 | * | 10/2001 | Chiang et al. ............. 438/622 |
| 6,340,631 B1 | | 1/2002 | Chih-Po et al. |
| 6,351,019 B1 | * | 2/2002 | DeBrosse et al. .......... 257/510 |
| 6,358,845 B1 | | 3/2002 | Lou |
| 6,441,469 B1 | | 8/2002 | Chrysostomides et al. |
| 6,448,591 B1 | * | 9/2002 | Juengling .................. 257/211 |
| 6,608,335 B2 | * | 8/2003 | Dixit et al. ................. 257/211 |

* cited by examiner

Primary Examiner—Michael S. Lebentritt
(74) Attorney, Agent, or Firm—Dinsmore & Shohl LLP

(57) ABSTRACT

A process to enhance metal line layout designs is provided and includes two separate control spaces to address capacitive issues along speed sensitive pathways in an integrated circuit structure without negatively impacting the Werner Fill process. One control space (i.e., $DRCgap_1$) is for decreasing the spacing between various metal features to standardize such spacing, and a second control space (i.e., $DRCgap_2$) is for addressing capacitance issues along speed sensitive pathways. Between speed sensitive pathways, spacing of added metal features provided to long parallel metal lines are maintained at the second control spacing $DRCgap_2$. Spaces at the ends of such long parallel metal lines are reduced to the first control spacing $DRCgap_1$ in order to best fill three-way-intersections (TWIs) with subsequent depositions.

18 Claims, 2 Drawing Sheets

DESIGN LAYOUT METHOD FOR METAL LINES OF AN INTEGRATED CIRCUIT

BACKGROUND OF THE INVENTION

This invention relates to a design layout method for metal lines of an integrated circuit (IC), and more particularly relates to a method of spacing metal lines in an integrated circuit to minimize capacitive issues along speed sensitive pathways in a random access memory structure to reduce signal delay without negatively impacting the Werner Fill process.

The Werner Fill process is disclosed by commonly owned U.S. Pat. No. 5,981,384, the disclosure of which is herein fully incorporated by reference. The Werner Fill process modifies the layout of electrically unisolated or live metal lines so that the spacing between the metal lines is substantially standardized prior to performing deposition of an intermetal dielectric layer (IDL). According to the Werner Fill process, circuit layout design modifications are made by adding dummy metal line features in areas of the layout having open spaces between parallel metal lines, and adding metal line spacers to existing metal lines to reduce the spacing therebetween to a standardized spacing or gap. As the nonstandard spacing between metal lines becomes standardized to the standardized spacing or gap, an intermetal dielectric deposition results in a planarized surface of the intermetal dielectric. Consequently, many conventional process steps for planarizing the intermetal dielectric can be skipped or simplified.

However, as semiconductor device geometries continue to decrease in size, providing more devices per fabricated wafer, capacitance between metal line features (dummy and/or live) becomes an issue. Currently, some devices are being fabricated with spacing between metal line features of less than about 0.25 $\mu$m, and in some cases, the spacing between metal line features is as little as about 0.11 $\mu$m. Since delay of a signal through a metal line is directly proportional to capacitance, and capacitance is inversely proportional to spacing, further reductions in spacing will cause increases in capacitance, and thus substantial signal delay. This increased signal delay along long, substantially parallel metal lines features, which typically are speed sensitive pathways, has noticeably affected the other desire in the art to provide faster semiconductor devices. Accordingly, a need still exists to minimize capacitive issues (i.e., increased capacitance) along steed sensitive pathways in a random access memory structure to reduce signal delay without negatively impacting the Werner Fill process.

SUMMARY OF THE INVENTION

The inventive process enhances metal line layout designs by providing two separate control spaces for the Werner Fill process along speed sensitive pathways. Speed sensitive pathways are defined by long, substantially parallel metal lines that typically extending over 10 $\mu$m in length. One control space (i.e., DRCgap$_1$) is for decreasing the spacing between various metal features to standardize such spacing according to the Werner Fill process. A second control space (i.e., DRCgap$_2$) is for addressing capacitance issues along speed sensitive pathways. For example, for a speed sensitive pathway where there are two long parallel adjacent metal lines, the Werner Fill process would bring the space between these lines down to a space defined by DRCgap$_1$ by adding metal line features or spacers. Instead, according to the present invention, the added metal line features or spacers provide a fundamental space between these lines of DRCgap$_2$, which is defined to be somewhere between DRCgap$_1$ and the maximum space that will still be readily fillable with IDL, and thus without negatively impacting the Werner Fill process. At the ends of the long parallel metal lines, the spacing of the added metal line features, or spacers, is reduced to the first control spacing DRCgap, in order to best fill the three-way-intersections (TWIs) with subsequent dielectric depositions.

After the IC structure has been designed to minimize the spacing and capacitance between nearest parallel metal lines according to the inventive process, a deposition of an intermetal dielectric layer is made. Although the present invention is not limited to specific advantages or functionality, it is noted that the present inventive process provides for the IC structure's substantial planarization due to the uniform spacing between metal features beneath the intermetal dielectric layer with the first control spacing DRCgap$_1$. Further, the present inventive process addresses capacitance issues along speed sensitive pathways of the IC structure due to providing a second control spacing DRCgap$_2$ between long parallel metal lines.

These and other features and advantages of the invention will be more fully understood from the following description of the various embodiments of the invention taken together with the accompanying drawings. It is noted that the scope of the claims is defined by the recitations therein, and not by the specific discussion of features and advantages set forth in the present description.

BRIEF DESCRIPTION OF THE DRAWINGS

The following detailed description of the various embodiments of the present invention can be best understood when read in conjunction with the following drawings, where like structure is indicated with like reference numerals, and in which.

Skilled artisans appreciate that elements in the figures are illustrated for simplicity and clarity and have not necessarily been drawn to scale. For example, the dimensions of some of the elements in the figures may be exaggerated relative to other elements to help to improve understanding of the various embodiments of the present invention.

DETAILED DESCRIPTION OF THE PREFERRED EMBODIMENTS

Figure 1:
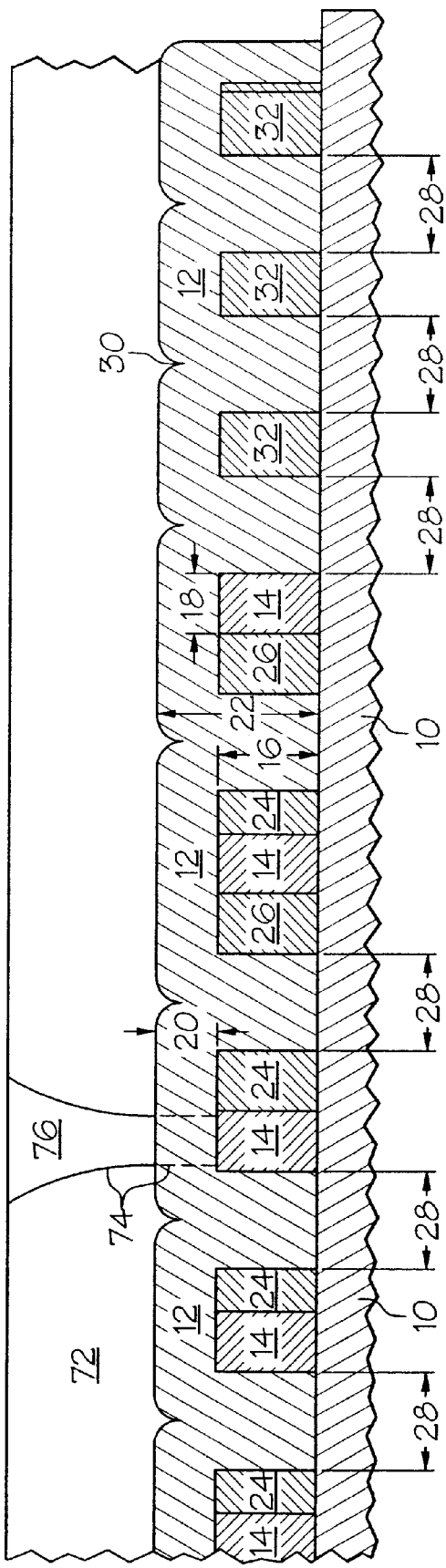
FIG. 1 is a fragmented section of an integrated circuit to illustrate enhanced metal line dimensions and dummy metal features added so as to standardize the spacing between metal features.

FIG. 1 depicts in cross section, an integrated circuit structure with a metal line layout design having standardized spaces between nearest metal features thereon according to the Werner Fill process. As previously mentioned, commonly assigned U.S. Pat. No. 5,981,384, discloses the Werner Fill process, of which the entire disclosure is incorporated fully by reference. Additionally, sections of that disclosure are reproduced hereinafter for better understanding of the inventive modification made to the Werner Fill process. Furthermore, as used herein the term "metal features" refers to all metal features (dummy, spacers, and lines) provided under the intermetal dielectric layer (IDL).

In FIG. 1, a substrate 10 has an intermetal dielectric layer (IDL) 12 situated thereon. The IDL 12 is also situated upon a series of metal lines 14. The metal lines 14 are placed upon substrate 10 by conventional techniques, such as for example, by metal deposition and patterning. After the foregoing metal patterning process, or variations thereof, each metal line 14 has a thickness $T_{met}$ 16 and has a width $W_{met}$ 18. The thickness of the IDL 12 is $T_{idl}$ 20. In one embodiment, $T_{idl}$ has a value of at least $(\sqrt{2}\ S_{met})/2$, where $S_{met}$ is a standardized distance explained hereafter. The altitude of the top surface of the IDL 12 is $T_{met}+T_{idl}$, and is indicated by reference numeral 22.

Enhanced metal line features, or spacers, 24 and 26 are provided adjacent to the metal lines 14 to standardize the spacing therebetween. Spacers 24 and 26 increase the resultant width of the metal lines 14 to result in the standardized distance $S_{met}$ 28 between nearest parallel metal features seen in FIG. 1. By standardizing the spacing between nearest parallel metal features to $S_{met}$ 28, depositing the IDL 12 to altitude 22 provides fused trenches between enhanced metal features, as seen at 30 in FIG. 1. Consequently, the top surface of the IDL 12 is substantially planarized after a single deposition process step.

Figure 2:
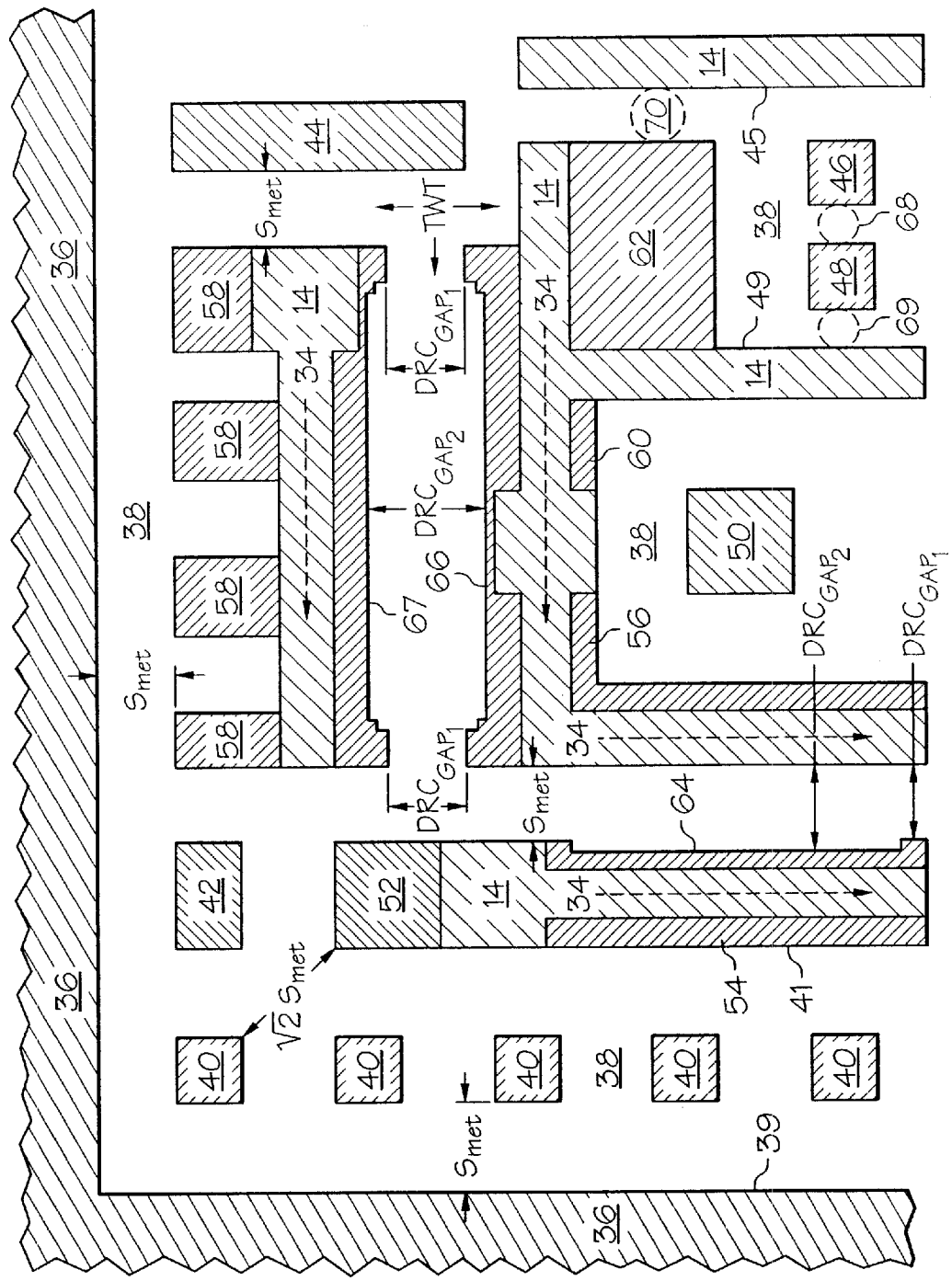
FIG. 2 shows a top view of an integrated circuit metal line layout design circumscribed within a guard ring at the periphery thereof, and having both a standardized spacing and a reduced standardized spacing between speed sensitive parallel metal lines to minimize signal delay due to capacitances.

FIG. 1 also shows the addition of dummy metal features 32, where large areas of spacing exist on substrate 10 for which there are no metal lines 14. Again, each dummy metal feature 32 is as small as possible without introducing possible defects (e.g., lifting), and has a spacing of $S_{met}$ 28 to other metal features. However, with spacing $S_{met}$ 28 under a critical dimension (e.g., less than 0.25 µm), capacitance issues between metal lines 14 results in signal delays along speed sensitive pathways, indicated by reference numeral 34 (FIG. 2). The present invention addresses capacitive issues along speed sensitive pathways by the hereafter-described methodology.

Referring to FIG. 2, capacitance along the speed sensitive pathways 34 of the metal line layout seen in FIG. 1 can be minimized, thereby reducing the signal delay therethrough. In FIG. 2, these speed sensitive pathways 34 are defined by long parallel metal lines 14 which extend in length at least 10 µm. Before depositing the IDL 12, a number of dummy metal features 40, 42, 44, 46, 48, and 50 are added in open space 38, and a number of enhanced metal line features or spacers 52, 54, 56, 58, and 60 are added to existing metal lines 14 according to the Werner Fill process.

Dummy metal features 40–50 and spacers 52–60 are added to standardize the distance between nearest parallel metal features of non-speed sensitive pathways, and/or nearest parallel metal features to a guard ring 36. The standardized spacing between these metal features and/or guard ring 36 is $S_{met}$. In one embodiment, the selection of the standardized spacing $S_{met}$ is a function of thickness of the IDL 12 as well as, the metal layer thickness. In another embodiments, the distance between all non-speed sensitive metal features, including guard ring 36, is spacing $S_{met}$ with the exception of a distance of about $\sqrt{2}\ S_{met}$ between the nearest diagonally spaced points on metal features. This is illustrated in the upper left corner between dummy metal feature 40 and spacer 52. In these embodiments, by standardizing the distance between metal features, the deposition of the IDL 12 results in a planarized top surface of the intermetal dielectric layer, as well as a minimized thickness of the intermetal dielectric layer between non-speed sensitive pathways.

When redesigning a conventional IC structure so as to standardize spacing between metal features to spacing $S_{met}$, n is calculated according to the following Equation A:

$$A: S_{min} < S_{met} <= [1.4(n+1)T_{idl}] + (n)W_{met}];$$

where n is a maximized whole number of metal features, $W_{met}$ is the smallest standardized width of the metal line, and $S_{min}$ is the limit dimension by photolithography as a design rule. Further, it is to be appreciated that spacing $S_{met}$ is also not greater than twice thickness $T_{idl}$, and that n is not greater than:

$$n < (S_{met} - 1.4T_{idl})/(1.4T_{idl} + W_{met}).$$

The foregoing Equation A is calculated for a maximized n for each area of the IC structure having an open space between nearest parallel metal features. The resultant calculated metal spacing $S_{met}$ is constrained by the requirement that it must be less than or equal to twice the IDL thickness $T_{idl}$, for nearest metal features parallel to one another. Furthermore, $S_{met}$ must be than the design rule $S_{min}$.

Once the maximized value of n is known, dummy metal features such as, for example, 40–50, are added to the open space 38 according to the value of n. By way of example, points 45 and 49, seen in the lower right hand corner, show the addition of two dummy metal feature 48 and 46. Thus, the maximized value of n for open space 38 between points 45 and 49 is 2. Points 39 and 41, seen in the lower left hand corner of FIG. 2, show only one dummy metal feature 40 therebetween, which indicates that the maximized value of n is 1 given open space 38 between points 39 and 41.

The foregoing Equation A presumes that all dummy metal features that are added to the design layout in the open spaces according to maximized integer n, shall have a substantially constant width of $W_{met}$ which is the same as the smallest possible metal line as defined by design rules and the photolithography process.

Where the foregoing equation results in a maximized value of n that is less than 1, or the remaining open space between is greater than the standardized spacing of $S_{met}$, then existing metal lines can have metal line features added thereto so as to reduce the spacing between metal features or the guard ring 36 to a standardized spacing. By way of example, FIG. 2 shows metal line spacers 58 having a distance of $S_{met}$ to guard ring 36. In this case, metal line 14 was enhanced by spacers 58 to standardize the distance to guard ring 36 to be $S_{met}$.

Spacers 58 are to be contrasted with spacers 54 and 56, in that spacers 54 and 56 are continuous in length, whereas spacers 58 are staggered rather than continuous. By staggering spacers 58, there is a reduction in capacitive coupling between two adjacent but isolated metal lines as compared to spacers 54 and 56 against metal lines 14. Such staggering of spacers 58 can be accomplished while still maintaining a standardized separation between metal features of $S_{met}$. Similarly, dummy metal features 40, by staggering the same, cause less capacitive coupling between metal lines 14 as compared to dummy metal feature 44. Furthermore, dummy metal features 40 are less likely to cause a yield loss due to electrically conductive particles as compared to the dummy metal feature 44.

It is also preferable that both the dummy metal features and the enhanced metal line features or spacers be kept as small as possible. According to the implementation of Equation A, rather than increasing the size of a spacer, it is better to maximize the number of dummy metal features n so as to fill up open space between nearest parallel metal features.

The reason for this is to minimize the metal line coupling capacitance inherent in larger metal lines. An inherent problem in increasing coupling capacitance is that it tends to slow down the circuit and to consume more power.

As a negative example of this benefit, spacer 62 has been added above point 49 and is increased in size at the right side from metal line 14 to allow only one space between itself and the adjacent metal line 14. When only one space exists between electrically conductive metal features, the chances for an electrically conductive particle impurity being entrapped therein or any other particle "masking" the gap during metal etching and causing a short between the metal features represents a high probability. By way of example, spacer 62 is in contact with an electrically conductive particle 70 having a width of $S_{met}$ or greater, where particle 70 is also in contact with metal line 14 above point 45 thereon. Particle 70 will serve to short out spacer 62 and metal line 14.

Conversely, by increasing the number of dummy metal features placed within an open area between nearest parallel electrically conductive metal lines, there is a lesser probability of entrapping conductive or "masking" particles so as to short out the electrically conductive metal lines 14. By way of example, dummy metals lines 46 and 48 between points 45 and 49 have particles 68 and/or 69 entrapped therebetween. Because dummy metal features 46 and 48 are electrically isolated, particles 68 and/or 69 will not cause a shorting out of metal lines 14 at points 45 and 49. Thus, open area 38 between dummy metal features 46 and 48 serves as a means to entrap electrically conductive or "masking" particles 68 and/or 69. Any such electrically isolated dummy metal feature will help to entrap electrically conductive or "masking" particles, rather than allowing them to reduce the yield by shorting out nearest parallel, electrically conductive metal lines 14.

Furthermore, the capacitive issues along speed sensitive pathways 34 are addressed by using at least two control widths for the standardized spacing $S_{met}$ between such metal line features 14. In particular, a first control space $DRCgap_1$ is for decreasing the spacing between various metal features to standardize such spacing, and is typically set at $S_{met}$. A second control space $DRCgap_2$ is for minimizing capacitance along the speed sensitive pathways 34.

By way of example, spacers 64, 66, and 67 have been added according to the present invention to existing metal lines 14 that are designated as speed sensitive pathways 34. Typically, speed sensitive pathways are defined by long parallel adjacent metal lines 14. Accordingly, between a speed sensitive pathway, where there are two long parallel adjacent metal lines 14, spacing of the added metal line feature(s), such as spacer 64, to other metal features, such as metal line 14, and/or spacing between adjacent pairs of spacers, such as 66 and 67, is maintain at the second control spacing $DRCgap_2$. It is to be appreciated that $DRCgap_2$ is defined to be between $DRCgap_1$ and the maximum space that will still be readily filled with the IDL 12 without negatively impacting the Werner Fill process.

The spaces between metal lines and/or metal features at the ends of such long parallel adjacent metal lines are reduced to the $DRCgap_1$ space in order to best fill three-way-intersections (TWIs) with subsequent depositions. A TWI is illustrated on the right hand side of FIG. 2, next to dummy metal feature 44. Additionally, the adjustment of the spacing between spacers and metal features along the speed sensitive pathways 34 from $DRCgap_1$ to $DRCgap_2$ may be incremental forming steps, as illustrated between spacers 66 and 67, and/or may be immediate with no incremental spacing steps (i.e., $DRCgap_2$ then $DRCgap_1$), such as illustrated by spacer 64 and the adjacent metal line 14. The relationship between these control spaces is $DRCgap_2 > DRCgap_1 \geq S_{met}$. In one embodiment, $S_{met}$ is from about 0.11 µm to about 0.25 µm.

By implementing the spacing methodology of the present invention, speed issues between speed sensitive pathways are improved without negatively impacting the Werner Fill process. In this manner, the altitude of the top surface of the IDL 12 will be the same over open spacing areas as well as over most metal features resulting in a substantially planarized IDL with fused trenches between metal features.

Accordingly, after depositing IDL 12, continued fabrication of the IC structure may proceed without the need for a planarization stage. For example and referring back to FIG. 1, such continued fabrication includes applying a layer of photoresist 72 over the IDL 12, and exposing the layer of photoresist in an area positioned over at least one metal lines 14. The layer of photoresist is developed to open at least one via 74 positioned over the at least one of the metal lines 14, such that a second metal line 76 can be deposited into the via so as to make underlying contact with the metal line 14.

Since there are no further processing steps for the planarization of the IDL 12, the dielectric layer can be kept thin (i.e., about 5000 to about 7000 Angstroms). Accordingly, the IDL 12 will have a good uniformity, and the aspect ratio for subsequent vias 74 to be patterned will result in a favorable consistent aspect ratio and good step coverage in the vias during the next metal layer to be deposited thereover. This process can be repeated for an unlimited number of metal line layers.

While the invention has been described in detail in connection with a number of various embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed is:

1. A method of fabricating an IC structure comprising:
providing a plurality of metal features on a substrate, said plurality of metal features including at least two substantially parallel adjacent metal lines having a speed sensitive pathway, each one of said metal lines having a substantially equal height $T_{met}$ and a separation $S_{met}$ from the nearest of the other metal features; and
providing at least one enhanced metal line feature along at least one of said metal lines, said enhanced metal line providing a first control spacing $DRCgap_1$ between said metal lines, and a second control spacing $DRCgap_2$ between said metal lines along said speed sensitive pathway, wherein $DRCgap_2 > DRCgap_1$.

2. The method of claim 1, wherein $DRCgap_1 \geq S_{met}$.

3. The method of claim 1, wherein the change from the first control spacing $DRCgap_1$ to the second control spacing $DRCgap_2$ is incremental.

4. The method of claim 1 wherein at an end of said speed sensitive pathway said enhanced metal line feature is decreased from $DRCgap_2$ to $DRCgap_1$.

5. The method of claim 1, wherein said plurality of metal features includes metal lines, and dummy metal features.

6. The method of claim 1, further comprising depositing a dielectric layer having a thickness of $T_{idl}$, over said metal features, and wherein providing said plurality of metal features on said substrate includes:

patterning n dummy metal features, each having a width $W_{met}$, and being situated in the separation between said metal features to provide said separation $S_{met}$, wherein:

$S_{met}$ is not greater than $(1.4(n+1)T_{idl})+(n)W_{met})$ or twice $T_{idl}$;

n is a maximized whole number not greater than $(S_{met}-1.4T_{idl})/(1.4T_{idl}+W_{met})$;

one of said plurality of metal features is diagonally spaced from the nearest portion of another one of said plurality of metal features by a distance that is equal to $\sqrt{2} S_{met}$; and said thickness of $T_{idl}$ has a value of at least $(\sqrt{2} S_{met})/2$.

7. The method of claim 6, wherein the maximum spacing between nearest diagonally spaced points on said metal lines is less than or equal to about twice the thickness of the dielectric layer.

8. The method of claim 6, wherein the minimum width of said metal features and the minimum spacing between the closest parallel metal features are about equal, except along said speed sensitive pathway.

9. The method of claim 1, wherein $DRCgap_2$ is defined between $DRCgap_1$ and the maximum space that can be readily filled with an intermetal dielectric layer without negatively impacting the Werner Fill process.

10. The method of claim 6, further comprising a guard ring circumscribing said metal features, said guard ring having said separation $S_{met}$ to the nearest metal feature parallel thereto.

11. A method of fabricating an IC structure comprising:

providing a plurality of metal features on a substrate, said plurality of metal features including at least one speed sensitive pathway, each one of said metal features having a substantially equal height $T_{met}$ and a separation $S_{met}$ from the nearest of the other metal features; and providing at least one enhanced metal line feature, said enhanced metal line providing a first control spacing $DRCgap_1$ between said metal features, and a second control spacing $DRCgap_2$ between said metal features along said speed sensitive pathway, wherein $DRCgap_2 > DRCgap_1$.

12. The method of claim 11, wherein $DRCgap_1 \geq S_{met}$, and $S_{met}$ is from about 0.11 µm to about 0.25 µm.

13. The method of claim 11, wherein the change from the first control spacing $DRCgap_1$ to the second control spacing $DRCgap_2$ is incremental.

14. The method of claim 11, wherein the change from the first control spacing $DRCgap_1$ to the second control spacing $DRCgap_2$ is immediate.

15. The method of claim 11 wherein at an end of said speed sensitive pathway said metal line feature is decreased from $DRCgap_2$ to $DRCgap_1$ in order to best fill three-way-intersections.

16. The method of claim 11, wherein $DRCgap_2$ is defined between $DRCgap_1$ and the maximum space that can be readily filled with an intermetal dielectric layer without negatively impacting the Werner Fill process.

17. The method of claim 11, wherein said speed sensitive pathway extends greater than about 10 µm.

18. A method of fabricating an IC structure comprising:

patterning a plurality of metal lines on a substrate each having a height $T_{met}$, at least two of said metal lines being substantially parallel and adjacent to each other having at least one speed sensitive pathway;

patterning n dummy metal features, each having a width $W_{met}$, in separations between said metal lines;

providing a standard spacing $S_{met}$ between each metal line and the nearest of one of said dummy metal features; and providing at least one enhanced metal line feature along said speed sensitive pathway, said metal line feature providing a first control spacing $DRCgap_1$ between said adjacent metal lines, and a second control spacing $DRCgap_2$ between said adjacent metal lines along said speed sensitive pathways, wherein $DRCgap_2 > DRCgap_1$.

* * * * *

UNITED STATES PATENT AND TRADEMARK OFFICE
CERTIFICATE OF CORRECTION

PATENT NO. : 6,696,359 B1
DATED : February 24, 2004
INVENTOR(S) : Philip J. Ireland It is certified that error appears in the above-identified patent and that said Letters Patent is hereby corrected as shown below:

Column 1,
Line 48, "steed" should read as -- speed --

Column 2,
Line 7, "DRCgap," should read as -- $DRCgap_1$ --

Column 4,
Line 20, "$T_{idl}$," should read as -- $T_{idl}$ --
Line 21, ""must be than" should read as -- must be larger than --

Column 6,
Line 4, "$DRCgap_2 > DRCgap_1 \geqq S_{met}$." should read as -- $DRCgap_2 > DRCgap_1 \geq S_{met}$. --
Line 57, "$DRCgap_1 \geqq S_{met}$." should read as -- $DRCgap_1 \geq S_{met}$. --
Line 67, "$T_{idl}$," should read as -- $T_{idl}$ --

Column 8,
Line 4, "$DRCgap_1 \geqq S_{met}$," should read as -- $DRCgap_1 \geq S_{met}$, --

Signed and Sealed this

Fifth Day of July, 2005

JON W. DUDAS
*Director of the United States Patent and Trademark Office*